(12) United States Patent
Franceschin et al.

(10) Patent No.: US 11,936,339 B2
(45) Date of Patent: Mar. 19, 2024

(54) VOLTAGE CONTROLLED OSCILLATOR WITH SERIES RESONANT CIRCUIT

(71) Applicant: STMicroelectronics S.r.l., Agrate Brianza (IT)

(72) Inventors: Alessandro Franceschin, Silea (IT); Andrea Mazzanti, Formigine (IT); Andrea Pallotta, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/894,548

(22) Filed: Aug. 24, 2022

(65) Prior Publication Data
US 2023/0081414 A1 Mar. 16, 2023

(30) Foreign Application Priority Data
Sep. 6, 2021 (IT) .......................... 102021000023000

(51) Int. Cl.
*H03B 5/12* (2006.01)
(52) U.S. Cl.
CPC .......... *H03B 5/1231* (2013.01); *H03B 5/1215* (2013.01); *H03B 5/1228* (2013.01); *H03B 5/124* (2013.01)
(58) Field of Classification Search
CPC .................................................... H03B 5/1231
USPC ...................................................... 331/117 R
See application file for complete search history.

(56) References Cited

U.S. PATENT DOCUMENTS

| 4,353,039 A * | 10/1982 | Huntley ................. H03K 3/283 331/116 R |
| 9,667,192 B2 | 5/2017 | Iotti et al. |
| 11,228,280 B1* | 1/2022 | Bahr ........................ H03B 5/04 |
| 2003/0210101 A1* | 11/2003 | McCorquodale ........ H03B 5/32 331/117 FE |
| 2013/0154752 A1 | 6/2013 | Lu et al. |
| 2017/0047890 A1 | 2/2017 | Lin et al. |

FOREIGN PATENT DOCUMENTS

| EP | 2034609 A2 | 3/2009 |
| JP | 2010193271 A | 9/2010 |
| WO | 2016164875 A1 | 10/2016 |

OTHER PUBLICATIONS

IT Search Report and Written Opinion for priority application, IT 102021000023000, report dated May 3, 2022, 8 pgs.
Tohidian, Massoud, et al.: "Dual-Core High-Swing Class-C Oscillator with Ultra-Low Phase Noise," Delft University of Technology, Delft, The Netherlands, 2013, 5 pgs.

* cited by examiner

Primary Examiner — Joseph Chang
(74) Attorney, Agent, or Firm — Crowe & Dunlevy LLC

(57) ABSTRACT

A voltage controlled oscillator includes a series resonant circuit having a resonance frequency and an active voltage driving device coupled to the series resonant circuit. The active voltage driving device provides a driving voltage and has an output negative resistance in an operative voltage range at the resonance frequency. The active voltage driving device includes a cross-coupled differential pair having voltage supply terminals providing the driving voltage. The series resonant circuit is coupled between the voltage supply terminals of the cross-coupled differential pair.

22 Claims, 3 Drawing Sheets

VOLTAGE CONTROLLED OSCILLATOR WITH SERIES RESONANT CIRCUIT

PRIORITY CLAIM

This application claims the priority benefit of Italian Application for Patent No. 102021000023000, filed on Sep. 6, 2021, the content of which is hereby incorporated by reference in its entirety to the maximum extent allowable by law.

TECHNICAL FIELD

Embodiments herein relate to a voltage controlled oscillator with series resonant circuit.

BACKGROUND

As is known, Voltage Controlled Oscillators (VCOs) are basic components in radio frequency (RF) systems and are used in transmitters and receivers for communication, sensing and radar applications. In telecommunications, for example, voltage controlled oscillators are normally the basis to establish frequency carrier, clock generation and bit recovery.

Phase noise is more and more often becoming a critical aspect in voltage controlled oscillators, especially in wireless communication, as the huge growth in demand of band resources and frequency channels imposes very strict requirements to minimize communication errors. For example, in high-order phase shift keying (PSK) or quadrature amplitude modulation (QAM), phase noise may lead to errors in decoding adjacent symbols. As it can be understood from the example shown in FIG. 1, phase noise may cause carriers corresponding to given symbols to shift to amplitude and phase ranges of adjacent symbols, thus causing interpretation errors.

Phase noise reduction is therefore a crucial goal to develop communication systems with higher capacity, due to wider bandwidth and spectrally efficient modulation schemes at up to millimeter wave carrier frequencies. According to a straightforward solution, phase noise in voltage controlled oscillators is reduced by scaling down the inductors of the parallel resonant circuit and increasing power consumption for a given supply voltage. However, the quality factor Q is degraded with the use of too small inductors and sets a lower bound on phase noise.

To overcome this limit, multi-core oscillators with parallel resonant circuits have been proposed, whereby N identical oscillators are coupled in a symmetric pattern to scale down phase noise by 10 log(N). Multi-core oscillators have been proven effective, but even minor mismatches between oscillators may significantly impair phase noise and penalize the figure of merit. Moreover, the required symmetric arrangement of the oscillators limits the number of cores that may be coupled together, thus also limiting the phase noise reduction that can be achieved. While in many applications multicore oscillators have provided a good solution, it cannot be expected that the strict requirements set by developments in telecommunications may be met.

There is accordingly a need in the art to provide a voltage controlled oscillator that allows the above described limitations to be overcome or at least attenuated.

SUMMARY

In an embodiment, a voltage controlled oscillator comprises: a series resonant circuit having a resonance frequency; and an active voltage driving device coupled to the series resonant circuit and configured to provide a driving voltage and to have an output negative resistance in an operative voltage range at the resonance frequency. The active voltage driving device comprises a cross-coupled differential pair having voltage supply terminals and the series resonant circuit is coupled to the voltage supply terminals of the cross-coupled differential pair.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION

Figure 1:
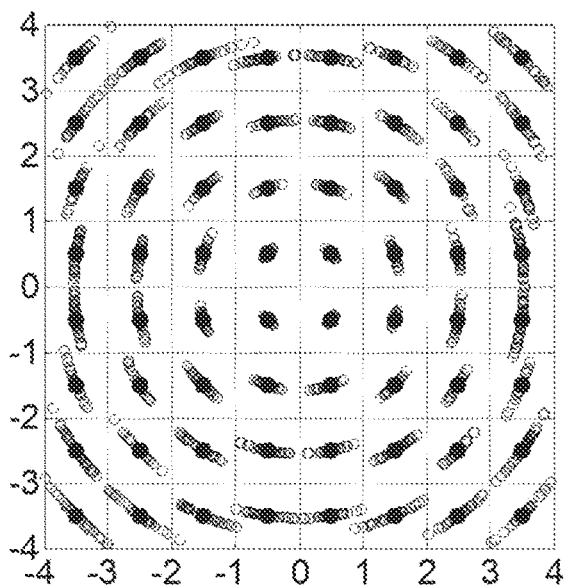
FIG. 1 is a graph showing effects of phase noise in a modulation scheme.
Figure 2:
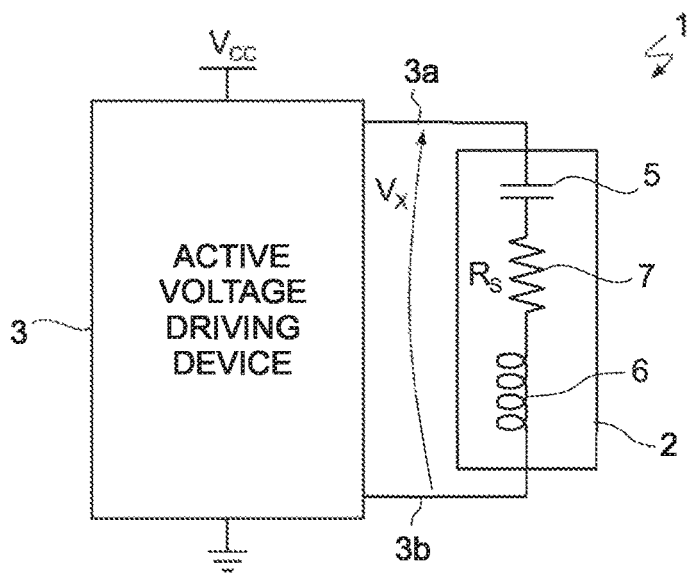
FIG. 2 is a simplified block diagram of a voltage controlled oscillator.

With reference to FIG. 2, a voltage controlled oscillator 1 in accordance with an embodiment comprises a series resonant circuit 2 and an active voltage driving device 3. The series resonant circuit 2 is coupled between voltage supply terminals 3a, 3b of the active voltage driving device 3. More specifically, the series resonant circuit 2 comprises a capacitive component 5, an inductive component 6 and a resistive component 7 coupled in series between the voltage supply terminals 3a, 3b. The resistive component 7 also includes the resistances of the capacitive component 5 and of the inductive component 6. Although it has been expressly indicated in FIG. 2 for the sake of clarity, a resistor as a separate component need not be included and the resistive component 7 may be defined exclusively by the resistances of the capacitive component 5 and of the inductive component 6, in accordance with design preferences. A series resistance $R_S$ is associated with the resistive component 7.

The series resonant circuit 2 is configured to resonate at a resonance frequency $\omega_0$ and has a series quality factor $Q_S$. In one example, the series quality factor $Q_S$ is 15.

Figure 3:
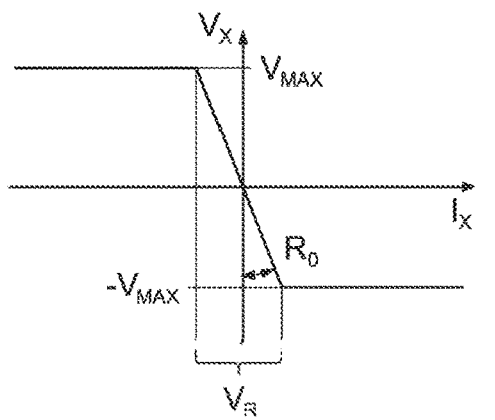
FIG. 3 is a graph showing quantities of the voltage controlled oscillator of FIG. 2.

The active voltage driving device 3 is configured to provide a driving voltage $V_X$ and to have a negative resistance in an operative voltage range $V_R$, as shown in FIG. 3. Out of the operative voltage range $V_R$, the driving voltage $V_X$ saturates to $\pm V_{MAX}$. At an equilibrium condition, both the driving voltage $V_X$ and a corresponding driving current $I_X$ are zero and the negative resistance is selected with respect to the series resistance $R_S$ of the series resonant circuit 2 to allow a build-up of oscillations.

Figure 4:
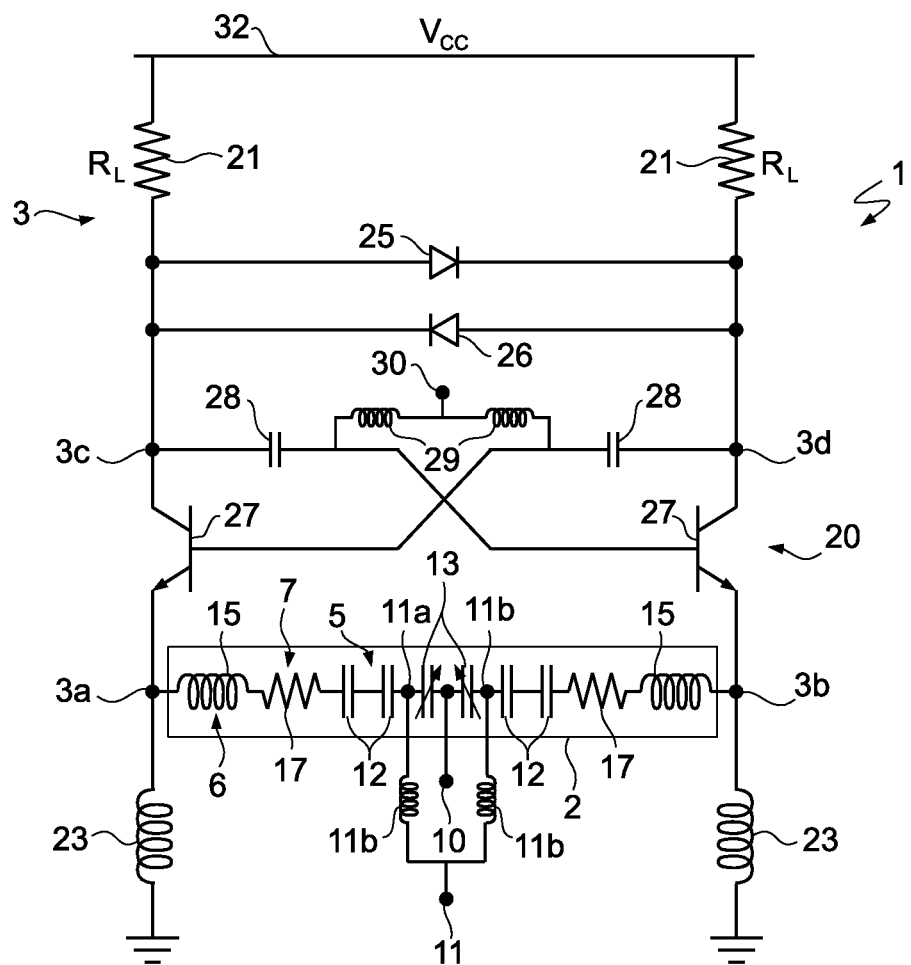
FIG. 4 is a circuit diagram of the voltage controlled oscillator of FIG. 2.

With reference to FIG. 4, where the voltage controlled oscillator 1 is illustrated in greater detail, the series resonant circuit 2 is provided with a tuning terminal 10 and a bias terminal 11 coupled to bias nodes 11a through respective bias components, e.g. bias inductors 11b. In order to reduce voltage drop on each capacitive member, in one embodiment the capacitive component 5 comprises a plurality of capacitors 12 and a pair of tuning varactors 13, coupled in series with one another symmetrically with respect to the tuning terminal 10. Specifically, the varactors 13 have respective first terminals coupled to the tuning terminal 10 and second terminals coupled to a respective one of the bias nodes 11. The capacitors 12 are symmetrically coupled to the bias nodes 11a, 11b on opposite sides of the varactors 13, to form a balanced capacitive structure.

In the embodiment of FIG. 4, the inductive component 6 comprises two inductors 15, symmetrically coupled to opposite terminals of the capacitive component 5 and further coupled to a respective one of the voltage supply terminals 3a, 3b of the active voltage driving device 3.

The resistive component 7 in turn comprises two resistors 17, each in series with a respective one of the inductors 15. The resistors 17 account for the resistance of the respective inductors 15 at the resonance frequency $\omega_0$ and may include additional separate components, in accordance with design preferences. For example, in low frequency applications, up to the kilohertz range, separate resistors may be provided, while at higher frequencies the resistive component 7 may be defined by the resistance of the inductors 15 alone.

The active voltage driving device 3 comprises a cross-coupled differential pair 20, load resistors 21, choke inductors 23 and saturator diodes 25, 26.

Figure 5:
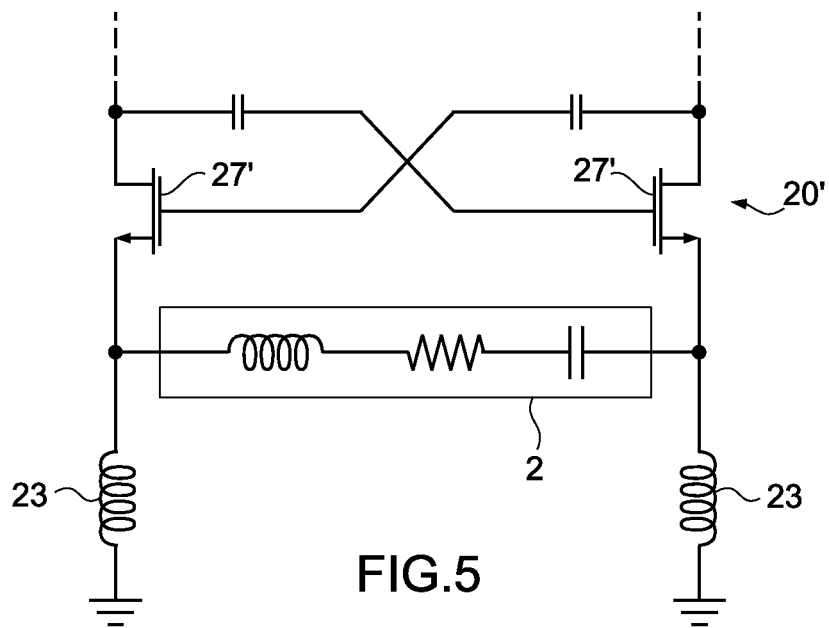
FIG. 5 is a partial circuit diagram of a different embodiment of a voltage controlled oscillator.

In the embodiment of FIG. 4, the cross-coupled differential pair 20 includes bipolar transistors 27 with respective base terminals coupled to collector terminals of the other transistor. Emitter terminals of the bipolar transistors 27 define the voltage supply terminals 3a, 3b of the active voltage driving device 3 (i.e., in order to drive voltage, as opposed to current, as emitter followers). The collector terminals of the bipolar transistors 27 define current supply terminals 3c, 3d for the load resistors 21. It is understood that bipolar transistors may be replaced by field effect transistors in the cross-coupled differential pair, as illustrated in FIG. 5, in which case the voltage supply terminals 3a, 3b and current supply terminals 3c, 3d are defined by source terminals (i.e., in order to drive voltage, as opposed to current, as source followers) and drain terminals of the field effect transistors, respectively.

Bias capacitors 28 in series with base terminals of respective transistors 27 and bias inductors 29 between the base terminals of respective transistors 27 and a bias terminal 30 provide appropriate DC bias to prevent the transistors 27 from operating in saturation region. The choke inductors 23 are in series with the emitter terminals of respective transistors 27 of the cross-coupled differential pair 20 and, beyond coupling a DC bias current component $I_B$ into the cross-coupled differential pair 20 to avoid saturation of the transistors 27, allow the emitter terminals thereof, i.e., the voltage supply terminals 3a, 3b, to move from ground voltage.

The load resistors 21 are coupled between the collector terminals of respective transistors 27 and a voltage supply line 32, providing a DC supply voltage $V_{CC}$. The load resistors have a matched load resistance $R_L$, whereby the differential output resistance $R_O$ at the voltage supply terminals 3a, 3b is $$R_O = -2R_L + 2/gm \approx -2R_L$$

in the operative voltage range $V_R$ (FIG. 3), because of the action of the cross-coupled differential pair 20. Moreover, the load resistance $R_L$ is selected to meet the conditions to trigger oscillation build-up, namely $$|R_O| = 2R_L > R_S$$

The saturator diodes 25, 26 are coupled in anti-parallel configuration between the collector terminals of the transistors 27 and are selected to precisely set the boundaries of the operative voltage range $V_R$, the maximum voltage value $+V_{MAX}$ and the minimum voltage value $-V_{MAX}$ for the driving voltage $V_X$, as shown in FIG. 3.

An estimation of phase noise associated with an oscillator at a given frequency offset $\Delta$ from the resonance frequency $\omega_0$ may be generally derived from Leeson's formula as follows:

$$\mathcal{L} = 10\log\left[\frac{2FkT}{P_S}\left(\frac{\omega_0}{2Q\Delta\omega}\right)^2\right]$$

where $\mathcal{L}$ is the phase noise, F is the noise factor, k is the Boltzmann constant and $P_S$ is the signal power associated with the resonant circuit of the oscillator.

In the voltage-driven series resonant circuit 2, the series signal power $P_{SS}$ is given by $$P_{SS} = \frac{V_{MAX}^2}{2R_S} = \frac{V_{MAX}^2}{2\omega_0}\frac{Q_S}{L}$$

where L is the inductance of the inductive component.

For a current-driven parallel resonant circuit with the same resistance, capacitance and inductance values as the series resonant circuit 2, the same resonance frequency $\omega_0$ and a parallel quality factor $Q_P$ equal to the series quality factor $Q_S$, the parallel signal power $P_{SP}$ is $$P_{SP} = \frac{V_{MAX}^2}{2R_P} = \frac{V_{MAX}^2}{2\omega_0}\frac{1}{LQ_P}$$

Hence $$P_{SS} = P_{SP}Q_P^2 = P_{SP}Q_S^2$$

Leeson's formula shows the reduction of phase noise provided by the voltage-driven series resonant circuit 2 compared to dual current-driven parallel resonant circuits with the same circuit parameters, resonance frequency and quality factor:

$$\mathcal{L}_S = 10\log\left[\frac{2FkT}{P_{SS}}\left(\frac{\omega_0}{2Q\Delta\omega}\right)^2\right] = 10\log\left[\frac{2FkT}{P_{SP}Q_S^2}\left(\frac{\omega_0}{2Q\Delta\omega}\right)^2\right] = \mathcal{L}_P - 10\log Q_S^2$$

The reduction in phase noise is so significant that the voltage-driven series resonant circuit 2 performs better than even dual current-driven parallel resonant circuits in multi-core configuration. Thus, on the one hand, the circuit structure and layout are simpler and much less chip area is occupied. On the other hand, the design of the voltage-driven series resonant circuit 2 is not limited by symmetry requirements, whereas oscillators based on the dual current-driven parallel resonant circuits must cope with the fact that increasing the number of cores beyond a few units may be very difficult, if at all possible.

The active voltage driving device 3 provides appropriate driving voltage and also negative resistance capable of causing oscillations to build up through voltage supply terminals of the cross-coupled differential pair, i.e., emitter terminals (or source terminals for FETs). Thus, the voltage controlled oscillator 1 allows advantages of the series resonant circuit 2 to be exploited through a simple, yet effective and reliable driving.

For high-frequency applications, parasitic components play a role that in some cases may not be neglected. The solution of a series resonant circuit coupled to voltage supply terminals of an active voltage driving device based on a cross-coupled differential pair applies as well.

Figure 6:
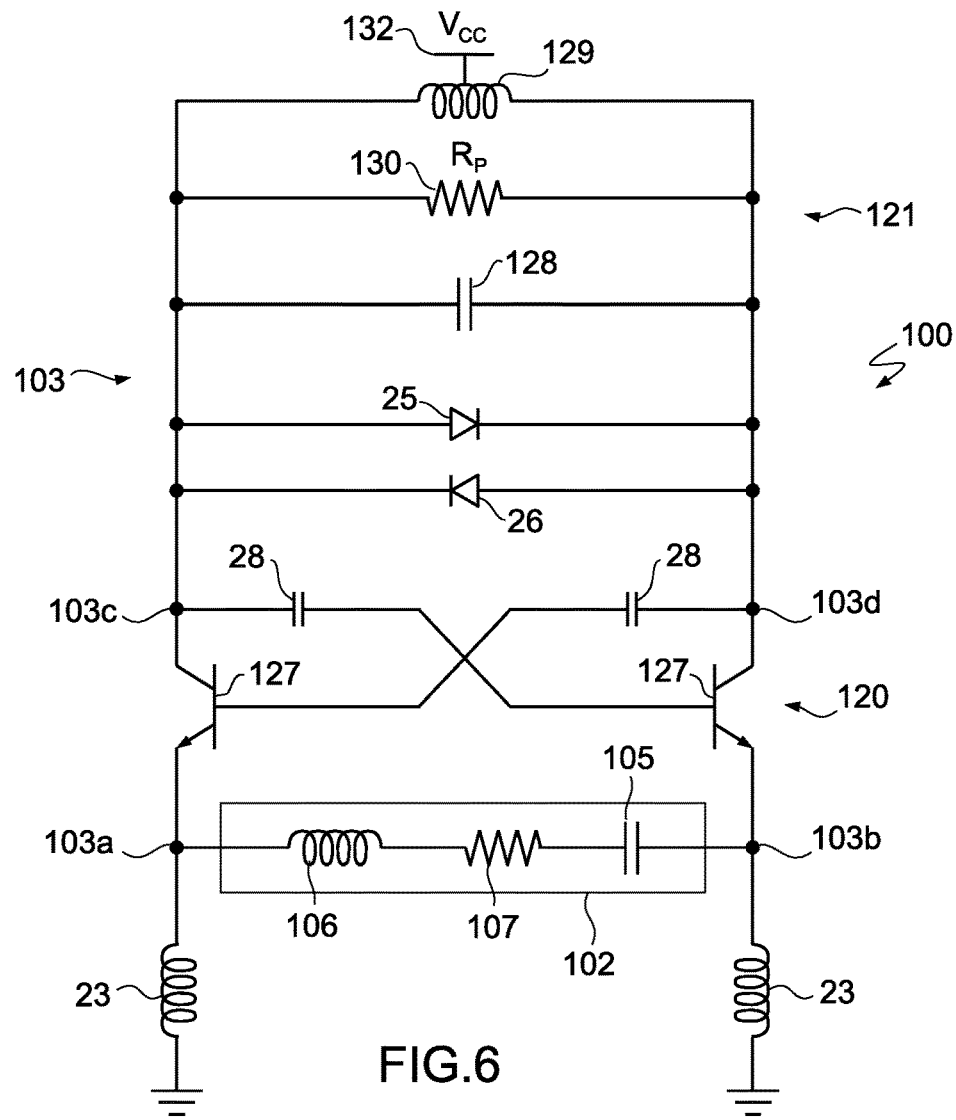
FIG. 6 is a partial circuit diagram of another embodiment of a voltage controlled oscillator.

According to the embodiment of FIG. 6, a voltage controlled oscillator 100 comprises a series resonant circuit 102 and an active voltage driving device 103.

Substantially as already described with reference to FIGS. 2 and 4, the series resonant circuit 102 is coupled between voltage supply terminals 103a, 103b of the active voltage driving device 103, and includes a series capacitive component 105, a series inductive component 106 and a series resistive component 107. Furthermore, the circuit 102 has a resonance frequency $\omega_0$ (e.g., 10 GHz) and a series quality factor $Q_S$. Here, the series resistive component 107 substantially coincides with a parasitic series resistance $R_S$ of the series inductive component 106 at the resonance frequency $\omega_0$. The series resistive component 107 may have the same structure as the resistive component 7 of FIG. 4.

The active voltage driving device 103 is configured to provide a driving voltage $V_X$ and to have a negative resistance with a V-I characteristic qualitatively similar to the one shown in FIG. 3.

The active voltage driving device 103 comprises a cross-coupled differential pair 120, a parallel resonant circuit 121, choke inductors 123 and saturator diodes 125, 126.

The cross-coupled differential pair 20 includes bipolar transistors 127 with respective base terminals coupled to collector terminals of the other transistor. Emitter terminals of the bipolar transistors 127 define the voltage supply terminals 103a, 103b of the active voltage driving device 3. The collector terminals of the bipolar transistors 127 define current supply terminals 103c, 103d for the parallel resonant circuit 121.

Bias components, not shown here, may be provided to apply appropriate DC bias to prevent the transistors 127 from operating in saturation region. The choke inductors 123 are coupled between the emitter terminals of respective transistors 127 of the cross-coupled differential pair 120 and ground and, beyond coupling a DC bias current component $I_B$ to the cross-coupled differential pair 120 to avoid saturation of the transistors 127, allow the emitter terminals thereof, i.e., the voltage supply terminals 103a, 103b, to move from ground voltage.

The parallel resonant circuit 121 is coupled between the collector terminals of the transistors 127 and includes a parallel capacitive component 128, a parallel inductive component 129 and a parallel resistive component 130.

The parallel capacitive component 128 accounts for parasitic capacitances at collector terminals of the transistors 127, i.e., at current supply terminals 103c, 103d. Parasitic capacitances have in fact actual and appreciable effects at higher frequencies, e.g., in the Gigahertz order or higher.

The parallel inductive component 129 is selected to tune a resonance frequency of the parallel resonant circuit 121 at the series resonance frequency $\omega_0$ of the series resonant circuit 102. A center point of the parallel inductive component 129 is coupled to a voltage supply line 132, providing a DC supply voltage $V_{CC}$.

The parallel resistive component 130 may be essentially determined by the parasitic resistance of the parallel inductive component 129 and is selected to meet the condition for build-up of oscillations in the series resonant circuit 103 at the series resonance frequency $\omega_0$. More precisely, the parallel resistance $R_P$ of the parallel resistive component 130 at the series resonance frequency $\omega_0$ is selected such that the differential output resistance $R_O$ at the voltage supply terminals 103a, 103b is as follows:

$$R_O = -R_P + 2/\text{gm} \approx -R_P$$

in the operative voltage range $V_R$ and meets the conditions to trigger oscillation build-up, namely $$|R_O| = |R_P| > R_S$$

The saturator diodes 25, 26 are coupled in anti-parallel configuration between the collector terminals of the transistors 127 and are selected to precisely set the boundaries of the operative voltage range $V_R$ and the maximum voltage value $+V_{MAX}$ and the minimum voltage value $-V_{MAX}$ for the driving voltage $V_X$, as shown in FIG. 3.

At the resonance frequency $\omega_0$, oscillation of the voltage controlled oscillator 100 is dominated by the series resonant circuit 102. The parallel resonant circuit 121 tunes at the resonance frequency $\omega_0$ as well and, in resonance conditions, the associated impedance is in fact the parallel resistance $R_P$ of the parallel resistive component 130. In practice, the parallel resonant circuit 121 is exploited to cancel effects of parasitic components so that, at the resonance frequency $\omega_0$, the parallel resonant circuit 121 defines a purely resistive load and the impedance results in the negative resistance required to build up and sustain oscillation. Operation at very high frequency is thus allowed and reduction of phase noise associated with the voltage-driven series resonant circuit 102 may be preserved.

Figure 7:
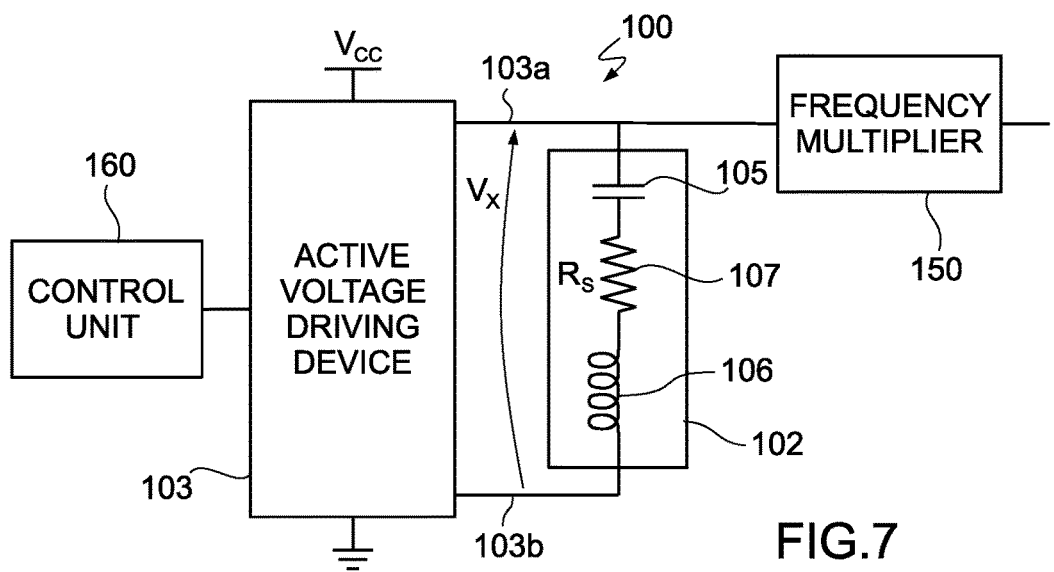
FIG. 7 is a block diagram of an electronic device including the voltage controlled oscillator of FIG. 6.

As an example, in FIG. 7 the voltage controlled oscillator 100 is configured to oscillate at a resonance frequency $\omega_0$ of 10 GHz and is coupled to a frequency multiplier 150, which provides frequency increase by a factor of 8. A control unit 160 controls operation of the voltage controlled oscillator 100, e.g., provides for enabling/disabling operation, tuning, testing and the like.

For the voltage controlled oscillator 100, phase noise at 1 MHz off the resonance frequency is −138 dBc/Hz, which results in −120 dBc/Hz at 80 GHz at the output of the frequency multiplier 150. The above level of phase noise allows the following modulation schemes to be implemented for example:

| Modulation | $L_S$ @1 MHz |
| --- | --- |
| QPSK | −90 dBc/Hz |
| 16 QAM | −96 dBc/Hz |
| 64 QAM | −102 dBc/Hz |
| 256 QAM | −108 dBc/Hz |
| 1024 QAM | −114 dBc/Hz |
| 4096 QAM | −120 dBc/Hz |

Finally, it is evident that modifications and variations may be made to the voltage controlled oscillator described, without thereby departing from the scope of the present invention, as defined in the annexed claims.

The invention claimed is:

1. A voltage controlled oscillator, comprising:
a series resonant circuit having a resonance frequency;
wherein the series resonant circuit has a series resistance;
a load having a load resistance; and
an active voltage driving device having an output negative resistance in an operative voltage range at the resonance frequency that is dependent on the load resistance, said active voltage driving device coupled to the series resonant circuit and configured to provide a driving voltage;

wherein the active voltage driving device comprises a cross-coupled differential pair having voltage supply terminals outputting said driving voltage; and wherein the series resonant circuit is coupled between the voltage supply terminals of the cross-coupled differential pair; and wherein, at the resonance frequency, an absolute value of the output negative resistance of the active voltage driving device is greater than the series resistance of the series resonant circuit;

wherein the cross-coupled differential pair has current supply terminals and the load is coupled to the active voltage driving device at the current supply terminals; and a first saturator diode and a second saturator diode coupled in anti-parallel configuration between the current supply terminals of the active voltage driving device.

2. The oscillator according to claim 1, wherein the cross-coupled differential pair comprises a pair of transistors in differential follower configuration and the voltage supply terminals are defined by output conduction terminals of the pair of transistors.

3. The oscillator according to claim 2, wherein the pair of transistors are bipolar transistors and the voltage supply terminals are defined by emitter terminals of the bipolar transistors.

4. The oscillator according to claim 2, wherein the pair of transistors are field effect transistors and the voltage supply terminals are defined by source terminals of the field effect transistors.

5. The oscillator according to claim 2, wherein the active voltage driving device comprises bias components coupled between the output conduction terminals of respective transistors of the cross-coupled differential pair and a reference voltage line and wherein the bias components couple a DC bias current component into the cross-coupled differential pair to avoid saturation of the pair of transistors.

6. The oscillator according to claim 1, wherein the load is a resistive load at the resonance frequency.

7. The oscillator according to claim 1, wherein the load comprises a pair of resistors coupled to the current supply terminals of the cross-coupled differential pair.

8. The oscillator according to claim 1, wherein the load comprises a parallel resonant circuit coupled between the current supply terminals of the cross-coupled differential pair and tuned at the resonance frequency.

9. The oscillator according to claim 8, wherein the parallel resonant circuit comprises a parallel capacitive component and wherein parasitic capacitances of the transistors form at least part of the parallel capacitive component.

10. The oscillator according to claim 9, wherein the parallel resonant circuit comprises a parallel inductive component selected to tune the parallel resonant circuit at the series resonance frequency.

11. The oscillator according to claim 10, wherein a center point of the parallel inductive component is coupled to a voltage supply line configured to provide a DC supply voltage.

12. The oscillator according to claim 10, wherein the parallel resonant circuit comprises a parallel resistive component that includes a parasitic resistance of the parallel inductive component.

13. An electronic system, comprising:
a voltage controlled oscillator according to claim 1; and
a control unit coupled to the voltage controlled oscillator.

14. The electronic system according to claim 13, comprising a frequency multiplier coupled to the voltage controlled oscillator and configured to multiply the resonance frequency by a multiplying factor.

15. A voltage controlled oscillator, comprising:
a series resonant resistor-capacitor-inductor circuit having a resonance frequency;
a cross-coupled differential pair of transistors including a first transistor with a first emitter terminal connected to a first node of the series resonant circuit and a second transistor with a second emitter terminal connected to a second node of the series resonant circuit;
a first inductor coupled between the first node and a ground node;
a second inductor coupled between the second node and the ground node;
a first capacitor coupled between a control terminal of the first transistor and a terminal of the second transistor; and
a second capacitor coupled between a control terminal of the second transistor and a collector terminal of the first transistor.

16. The oscillator according to claim 15, further comprising a third inductor having a first terminal coupled to the control terminal of the first transistor, a second terminal coupled to the control terminal of the second transistor, and a center tap terminal coupled to a bias voltage node.

17. The oscillator according to claim 15, further comprising a third inductor having a first terminal coupled to the collector terminal of the first transistor, a second terminal coupled to the collector terminal of the second transistor, and a center tap terminal coupled to a supply voltage node.

18. The oscillator according to claim 15, wherein the cross-coupled differential pair of transistors presents an output negative resistance in an operative voltage range at the resonance frequency.

19. A voltage controlled oscillator, comprising:
a series resonant resistor-capacitor-inductor circuit having a resonance frequency;
a cross-coupled differential pair of transistors including a first transistor with a first source terminal connected to a first node of the series resonant circuit and a second transistor with a second source terminal connected to a second node of the series resonant circuit;
a first inductor coupled between the first node and a ground node;
a second inductor coupled between the second node and the ground node;
a first capacitor coupled between a control terminal of the first transistor and a drain terminal of the second transistor; and
a second capacitor coupled between a control terminal of the second transistor and a drain terminal of the first transistor.

20. The oscillator according to claim 19, further comprising a third inductor having a first terminal coupled to the control terminal of the first transistor, a second terminal coupled to the control terminal of the second transistor, and a center tap terminal coupled to a bias voltage node.

21. The oscillator according to claim 19, further comprising a third inductor having a first terminal coupled to the drain terminal of the first transistor, a second terminal coupled to the drain terminal of the second transistor, and a center tap terminal coupled to a supply voltage node.

22. The oscillator according to claim 19, wherein the cross-coupled differential pair of transistors presents an output negative resistance in an operative voltage range at the resonance frequency.

\* \* \* \* \*